US008363314B2

(12) United States Patent
Oh et al.

(10) Patent No.: US 8,363,314 B2
(45) Date of Patent: Jan. 29, 2013

(54) REFLECTIVE SEMICONDUCTOR OPTICAL AMPLIFIER (R-SOA) AND SUPERLUMINESCENT DIODE (SLD)

(75) Inventors: Su Hwan Oh, Daejeon (KR); Sahnggi Park, Daejeon (KR); Yongsoon Baek, Daejeon (KR); Kwang-Ryong Oh, Daejeon (KR)

(73) Assignee: Electronics and Telecommunications Research Institute, Daejeon-city (KR)

( * ) Notice: Subject to any disclaimer, the term of this patent is extended or adjusted under 35 U.S.C. 154(b) by 59 days.

(21) Appl. No.: 12/929,970

(22) Filed: Feb. 28, 2011

(65) Prior Publication Data

US 2011/0150406 A1 Jun. 23, 2011

Related U.S. Application Data

(62) Division of application No. 11/924,772, filed on Oct. 26, 2007, now Pat. No. 7,920,322.

(30) Foreign Application Priority Data

Dec. 7, 2006 (KR) ........................ 10-2006-0124135

(51) Int. Cl.
*H01S 5/227* (2006.01)

(52) U.S. Cl. ........................................................ 359/344

(58) Field of Classification Search ................... 359/344
See application file for complete search history.

(56) References Cited

U.S. PATENT DOCUMENTS 4,159,452 A * 6/1979 Logan et al. ............... 372/45.01
4,371,966 A * 2/1983 Scifres et al. .............. 372/45.01
4,461,007 A * 7/1984 Burnham et al. .......... 372/45.01
4,631,730 A * 12/1986 Miller .......................... 372/50.1
4,680,769 A * 7/1987 Miller ........................ 372/50.22
4,726,031 A * 2/1988 Wakao et al. ................... 372/96
4,794,346 A * 12/1988 Miller ........................... 359/344
4,835,788 A * 5/1989 Yamaguchi ..................... 372/96
5,093,278 A * 3/1992 Kamei ............................ 438/40
5,202,285 A * 4/1993 Sugano et al. .................. 438/40

(Continued)

FOREIGN PATENT DOCUMENTS

JP 8-037341 A 2/1996
JP 10-098231 A 4/1998

(Continued)

OTHER PUBLICATIONS

Vu Doan Mien, Vu Thi Nghiem, Dang Quoc Trung and Tran Thi Tam. 1550nm InGaAsP/InP Semiconductor Optical Amplifier (SOA): the first study on module preparation and characterization. International Workshop on Photonics and Applications. Hanoi, Vietnam. Apr. 5-8, 2004.*

(Continued)

*Primary Examiner* — Mark Hellner
*Assistant Examiner* — Ari M Diacou
(74) *Attorney, Agent, or Firm* — Rabin & Berdo, P.C.

(57) ABSTRACT

Provided are a reflective semiconductor optical amplifier (R-SOA) and a superluminescent diode (SLD). The R-SOA includes: a substrate; an optical waveguide including a lower clad layer, an active layer independent of the polarization of light, and an upper clad layer sequentially stacked on the substrate, the optical waveguide comprising linear, curved, and tapered waveguide areas; and a current blocking layer formed around the optical waveguide to block a flow of current out of the active layer, wherein the linear and curved waveguide areas have a single buried hetero (BH) structure, and the tapered waveguide area has a dual BH structure.

11 Claims, 4 Drawing Sheets

200
37
38
35
36
34
33
32
31
d
c
b
a
14
13
12
11

U.S. PATENT DOCUMENTS 5,247,536 A * 9/1993 Kinoshita ..................... 372/96
5,288,659 A * 2/1994 Koch et al. ..................... 438/31
5,305,412 A * 4/1994 Paoli ..................... 385/122
5,349,597 A * 9/1994 Mizuochi ..................... 372/44.01
5,403,775 A * 4/1995 Holonyak et al. ..................... 438/38
5,438,583 A * 8/1995 Narui et al. ..................... 372/45.01
5,636,237 A 6/1997 Terakado et al.
5,657,338 A * 8/1997 Kitamura ..................... 372/50.1
5,693,965 A * 12/1997 Yamada ..................... 257/94
5,787,106 A * 7/1998 Tabuchi et al. ..................... 372/50.1
5,844,929 A * 12/1998 Lealman et al. ..................... 372/45.01
6,018,539 A * 1/2000 Kimura et al. ..................... 372/45.01
6,037,189 A * 3/2000 Goto ..................... 438/31
6,052,397 A * 4/2000 Jeon et al. ..................... 372/46.01
6,141,477 A * 10/2000 Kitamura ..................... 385/131
6,310,720 B1 10/2001 Walker et al.
6,324,204 B1 * 11/2001 Deacon ..................... 372/96
6,411,764 B1 * 6/2002 Lee ..................... 385/131
6,480,640 B1 * 11/2002 Shimonaka et al. ..................... 385/14
6,487,007 B1 11/2002 Morito
6,600,847 B2 * 7/2003 Saini et al. ..................... 385/14
6,670,203 B2 * 12/2003 Furushima ..................... 438/22
7,046,435 B2 * 5/2006 Shin et al. ..................... 359/344
7,920,322 B2 * 4/2011 Oh et al. ..................... 359/344
8,107,508 B2 * 1/2012 Oh et al. ..................... 372/92
2002/0031297 A1 * 3/2002 Forrest et al. ..................... 385/28
2003/0086654 A1 * 5/2003 Saini et al. ..................... 385/50
2005/0084991 A1 4/2005 Lee et al.
2005/0105171 A1 5/2005 Shin et al.
2005/0185264 A1 * 8/2005 Shin et al. ..................... 359/344
2006/0159133 A1 * 7/2006 Hwang et al. ..................... 372/19
2006/0165147 A1 * 7/2006 Kim ..................... 372/96
2006/0285560 A1 * 12/2006 Nagashima et al. ..................... 372/19
2007/0030866 A1 * 2/2007 Kim et al. ..................... 372/19
2010/0092175 A1 * 4/2010 Kim et al. ..................... 398/79
2010/0238962 A1 * 9/2010 Oh et al. ..................... 372/45.01
2010/0265980 A1 * 10/2010 Matsuda ..................... 372/46.01

FOREIGN PATENT DOCUMENTS

KR 10-2005-0082654 8/2005

OTHER PUBLICATIONS

“High Performance 1.55 μM Polarisation-Insensitive Semiconductor Optical Amplifier Based on Low-Tensile-Strained Bulk Galnasp” by J.-Y. Emery et al.,Electronics Letters, vol. 33, No. 12, Jun. 5, 1997.

“Narrow Beam 1.3 μM Superluminescent Diode With Butt-Jointed Selectively Grown Spot Size Converter” by H. Okamoto et al., Electronics Letter, vol. 33, No. 9, Apr. 24, 1997.

Kakitsuka et al. “Influence of Buried Structure on Polarization Sensitivity in Strained Bulk Semiconductor Optical Amplifiers,” IEEE Journal of Quantum Electronics, vol. 38, No. 1, pp. 85-92 (Jan. 2002).

* cited by examiner

REFLECTIVE SEMICONDUCTOR OPTICAL AMPLIFIER (R-SOA) AND SUPERLUMINESCENT DIODE (SLD)

CROSS-REFERENCE TO RELATED PATENT APPLICATION

This is a Divisional of U.S. application Ser. No. 11/924,772, filed Oct. 26, 2007, the subject matter of which is incorporated herein by reference. This application claims the benefit of Korean Patent Application No. 10-2006-0124135, filed on Dec. 7, 2006, in the Korean Intellectual Property Office, the disclosure of which is incorporated herein in its entirety by reference.

BACKGROUND OF THE INVENTION

1. Field of the Invention

This work was supported by the IT R&D program of MIC/IITA. [2005-S-051-02, Photonic device integrated module for optical access network]

The present invention relates to a semiconductor optical amplifier (SOA), and more particularly, to a reflective SOA (R-SOA) and a superluminescent diode (SLD) having low operating and threshold currents.

2. Description of the Related Art

An optical line terminal (OLT) and an optical network unit (ONU) used in a Wavelength Division Multiplexing Passive Optical Network (WDM-PON) have several types of light sources. According to a recently announced paper in IEEE PTL, vol. 18, no. 13, pp. 1436-1438, an OLT using a distributed feedback laser diode (DFB-LD), which oscillates in a single mode, and an ONU using a reflective-semiconductor optical amplifier (R-SOA), which depends on the polarization of the light, have been used to perform two-way communications of 1.25 Gbp/s or more.

A high-priced DFB-LD matching with a WDM channel is required to be replaced with a low-priced light source in order to lower a price of a WDM-PON. External cavity lasers (ECL), which can be manufactured at low cost, attract attention due to the above requirement. In such an ECL, a multichannel light source can be manufactured on a single substrate. Thus, lots of research into ECLs has been conducted. An ECL has a structure in which a grating is formed at a silica waveguide, and a semiconductor laser as a light source is hybrid integrated. The ECL must not oscillate so that reflectivity of an emission surface of the semiconductor laser as the light source of the ECL is 0.1% or less. Also, the ECL must be a device having a high gain at a low operating current. Fabry-Perot laser diodes (FP-LD) and superluminescent diodes (SLD) are available as light sources satisfying above-described conditions.

An anti-reflection (AR) coating of 0.1% or less is formed on a surface to reduce reflectivity of an emission surface of the FP-LD. Also, a high-reflection (HR) coating is formed on an opposite surface to obtain a high gain. For example, the Japanese NTT group manufactures multi-channel ECLs using FP-LD on which an AR coating and an HR coating are formed. However, in general, it is very difficult to form an AR coating of only 0.1% or less on an emission surface of a FP-LD in order to prevent oscillation. Also, yield is low.

A superluminescent diode (SLD) is a light source which can replace the AR coated FP-LD. An active layer or an optical waveguide is inclined at an angle of 7° or 10° in a general SLD to reduce reflectivity of an emission surface of the SLD. In this case, the reflectivity of the emission surface can be reduced, but the SLD is not suitable as a light source used for a WDM-PON due to a high threshold current and operating current. Thus, the SLD requires a light source having the same characteristic as an FP-LD on which an AR coating and an HR coating are formed.

Also, an R-SOA used in an ONU simply amplifies and modulates non-interferential light allocated to each subscriber. Thus, the R-SOA reduces noise due to a gain saturation characteristic without greatly changing output power in spite of a slight change of a spectrum according to external conditions. However, such an R-SOA requires a light source consuming a small amount of power at low threshold and operating currents to be used in a WDM-PON.

SUMMARY OF THE INVENTION

The present invention provides a reflective semiconductor optical amplifier (R-SOA) and a superluminescent diode (SLD) performing super-high modulations of 1.25 Gbp/s using a light source and having a low current and consuming a small amount of power at a low threshold current.

According to an aspect of the present invention, there is provided an R-SOA including: a substrate; an optical waveguide including a lower clad layer, an active layer independent of the polarization of light, and an upper clad layer sequentially stacked on the substrate, the optical waveguide including linear, curved, and tapered waveguide areas; and a current blocking layer formed around the optical waveguide to block a flow of current out of the active layer, wherein the linear and curved waveguide areas have a single buried hetero (BH) structure, and the tapered waveguide area has a dual BH structure.

According to another aspect of the present invention, there is provided an SLD including: a substrate; an optical waveguide including a lower clad layer, an active layer dependant on the polarization of light, and an upper clad layer sequentially stacked on the substrate, the optical waveguide including linear, curved, and tapered waveguide areas; and a current blocking layer formed around the optical waveguide to block a flow of current out of the active layer, wherein the linear and curved waveguide areas have a single BH structure, and the tapered waveguide area has a dual BH structure.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
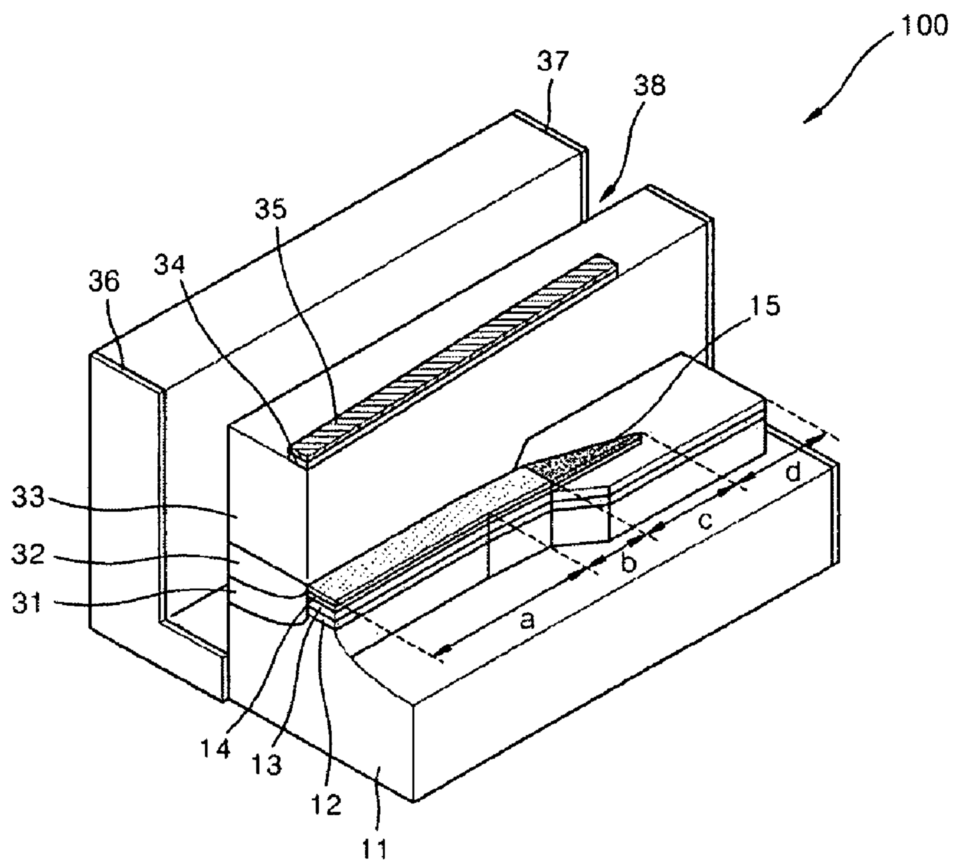
FIG. 1A is a perspective view of a superluminescent diode (SLD)/reflective semiconductor optical amplifier (R-SOA) 100 according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

In embodiments of the present invention, active layers of a superluminescent diode (SLD) and a reflective semiconductor optical amplifier (R-SOA) used in an optical line terminal (OLT) and an optical network unit (ONU) of a Wavelength Division Multiplexing Passive Optical Network (WDM-PON) have the same structure. However, growth layers and optical waveguides of the SLD and the R-SOA have different structures. In detail, the SLD has a multi quantum well (MQW) structure, which reduces compressive stress and has dependence on the polarization of the light, and the R-SOA has a bulk structure, which reduces stress and does not have dependence on the polarization of the light. Thus, if one of the SLD and the R-SOA is optimized, the optimized SLD or R-SOA may be applied to another structure.

The following conditions must be satisfied to manufacture an SLD/R-SOA appropriate as a light source of a WDM-PON system.

An SLD/R-SOA generally has a buried hetero (BH) structure or buried ridge stripe (BRS) structure. A process of manufacturing the BH structure is complicated. However, since the BH structure blocks a flow of current into other layers except for an active layer better than the BRS structure and thus has low current and high gain. Thus, the BH structure is suitable in a light source of the WDM-PON system to achieve the above-mentioned object.

An end of an optical waveguide must be tapered to reduce internal reflection of the SLD/R-SOA, heighten power, and increase mode size of radiation. If the width of the small end of the tapered end of the optical waveguide is less than or equal to 0.2 μm, the SLD/R-SOA has good characteristics. However, if the tapered end is grown using the BH structure, overgrowth is worsened at the small end of the tapered end. Thus, loss in the optical waveguide occurs. If the tapered end is made uniform using dry etching and then undercut using wet etching to control a width of the small end of the tapered end to 0.2 μm or less so as to reduce such loss, uniform overgrowth is possible. Thus, in the above-described, processes are consistent, and the characteristics of a manufactured optical device is also consistent. In the BRS structure, the width of the small end of the tapered end may be controlled to 0.2 μm or less. However, it is difficult to block a flow of current into other layers except for an active layer. Thus, it is difficult to obtain a low operating current and a high gain.

The tapered area lowers reflectivity from an incidence/emission surface of a resonator and allows light to be inclined at an angle of 7° or 15° with respect to the direction of propagation.

As the optical waveguide is inclined at a great angle, the reflectivity of the incidence/emission surface is lowered. Since loss in a curved waveguide is great, gain is reduced. A passive waveguide is formed under the active layer to increase coupling efficiency of light in order to minimize the loss. Also, if a width of the passive waveguide is within a range of between 7 μm and 9 μm, a far field pattern (FFP) of radiation of guided light is inclined at an angle of 15° or less. Thus, a size of a mode is about 3 μm.

The embodiments of the present invention provide an SLD/R-SOA suitable as a light source of a WDM-PON system satisfying the above-described conditions.

Figure 1B:
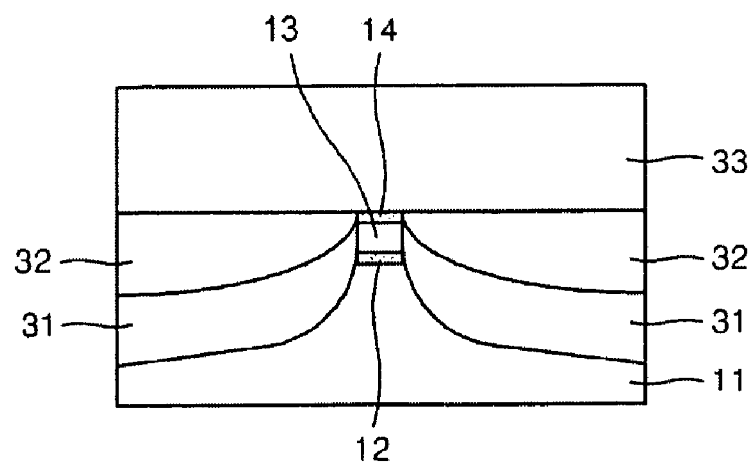
FIG. 1B is a cross-sectional view of an active area a of FIG. 1A.
Figure 1C:
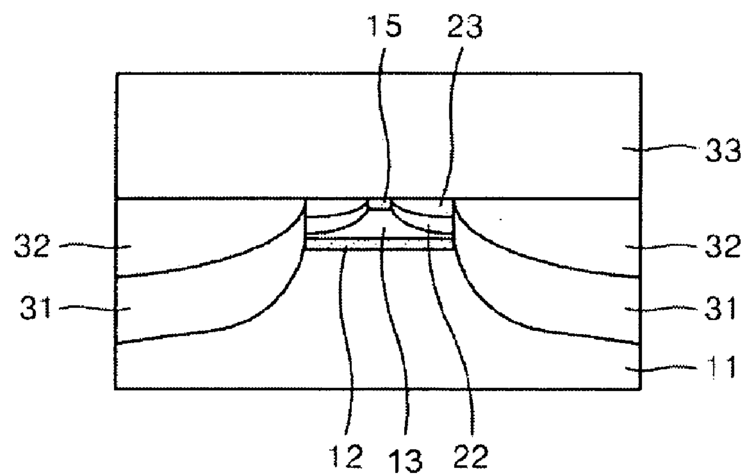
FIG. 1C is a cross-sectional view of a tapered area c of FIG. 1A.
Figure 1D:
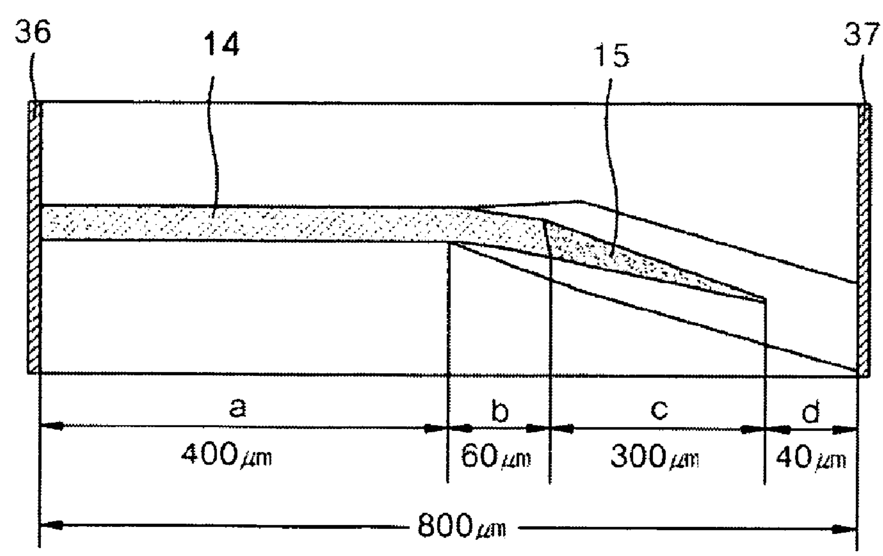
FIG. 1D is a schematic plan view of an optical waveguide of FIG. 1A.

FIG. 1A is a perspective view of an SLD/R-SOA 100 according to an embodiment of the present invention, FIG. 1B is a cross-sectional view of an active layer area a of FIG. 1A, FIG. 1C is a cross-sectional view of a tapered area c of FIG. 1A, and FIG. 1D is a schematic plan view of an optical waveguide of FIG. 1A. An active layer 14 is butt-coupled to a tapered optical waveguide 15 to form an optical waveguide area.

Referring to FIGS. 1A through 1C, the SLD/R-SOA 100 according to the present embodiment has a structure in which a passive waveguide 12 is formed under the active layer 14 to reduce loss of guided light. This structure is difficult to manufacture and thus is generally manufactured as a BRS structure. However, if the structure is manufactured as a BH structure, good characteristics can be obtained. However, in terms of manufacturing process, a waveguide formed by the active layer 14 and the tapered optical waveguide 15 has a different structure from a conventional waveguide due to the passive waveguide 12 formed under the tapered optical waveguide 15 to a width of between 7 μm and 9 μm. Thus, it is difficult to regrow the structure using the BH structure.

According to the present embodiment, a tapered area c which the passive waveguide 12 is wider than the tapered optical waveguide 15 and an area d combined with the passive waveguide 12 are formed as follows. To overcome the above-described difficulty, the tapered area c is formed using an epitaxial wafer on which the active layer 14 and the tapered waveguide 15 are formed by the butt-coupling method. The tapered area c is formed using a normal photolithography method. Thereafter, dry etching and wet etching are performed to form an InP layer 13 on the passive waveguide 12. p-InP 22 and n-InP 23 are grown as first current blocking layers. Also, an optical waveguide is formed from a linear waveguide area a to the passive waveguide 12 using an additional photolithography process. p-InP, n-InP, and p-InP layers 31, 32, and 33 are sequentially formed as second current blocking layers. A p-InP clad layer 33 and a p-InGaAs layer 34 as an ohmic layer are grown. The butt-coupling of the active layer 14 to the tapered optical waveguide 15 will be described with reference to FIG. 1D.

Referring to FIGS. 1A through 1C again, the SLD/R-SOA 100 includes the InGaAsP passive waveguide layer 12, the n-InP lower clad layer 13, the active layer 14, and the upper clad layer 33 which are sequentially stacked on an n-InP substrate 11. The SLD/R-SOA 100 also includes the linear waveguide area a, a curved waveguide area b, and the tapered waveguide area c. Here, the linear and curved waveguide areas a and b have a single BH structures, and the tapered waveguide area c has a dual BH structure. A light source having low operating and threshold currents can be manufactured due to the BH structures of the linear, curved, and tapered waveguide areas a, b, and c.

The first and second current blocking layers and a trench 38 are formed to perform a superhigh speed modulation of 1.25 Gbp/s or more in the SLD/R-SOA 100. Here, the current blocking layer blocks the flow of current into other layers except for the active layer 14, and the trench 38 has a trench shape and reduces a parasitic capacitance leaking to the surroundings of the active layer 14. Thus, the SLD/R-SOA 100 has a good superhigh speed modulation characteristic of 1.25 Gbp/s. The p-InP, n-InP, and p-InP layers 31, 32, and 33 are sequentially formed as the second current blocking layers. The second current blocking layers 31, 32, and 33 around the optical waveguide and a portion of the substrate 11 are selectively etched to form the trench 38. An anti-reflection (AR) coating 37 is formed at an end of the optical waveguide having the trench shape, and a high-reflection (HR) coating 36 is formed at an end of the linear waveguide area a. As previously described, the active layer 14 may have a multi quantum well (MQW) structure capable of reducing stress in the case of an SLD, but may have a bulk structure independent of the polarization of the light and capable of reducing stress in the case of an R-SOA.

Referring to FIG. 1D, the active layer 14 is butt-coupled to the tapered optical waveguide 15. The butt-coupling includes dry etching a portion of an active layer, selectively wet etching the dry etched portion, and regrowing an optical waveguide portion. For example, if the active layer 14 has a MQW structure with a width of 1.55 μm or a bulk structure with a width of 1.55 μm, the InGaAsP optical waveguide 15 having a width of between 1.24 μm and 1.3 μm is butt-coupled. If the active layer 14 has a MQW structure with a width of 1.3 μm or a bulk structure with a width of 1.3 μm, the InGaAsP optical waveguide 15 with a width of between 1.10 μm and 1.15 μm is butt-coupled. The AR coating 37 is formed on an emission surface of the SLD/R-SOA 100 to lower reflectivity, and the HR coating 36 is formed on an opposite surface to increase gain of the SLD/R-SOA 100. The SLD/R-SOA 100 includes the linear, curved, and tapered waveguide areas a, b, and c and the passive waveguide 12 under the active layer 14 to increase coupling efficiency of guided light so as to reduce absorption loss of light in the InP layer d outside the tapered area c.

An interface between the active layer 14 and the tapered optical waveguide 15 allows light to be inclined at an angle of 7° or 15° with respect to the direction of propagation in order to lower reflectivity from an incidence/emission surface. If the waveguide is inclined at a great angle, the reflectivity from the incidence/emission surface is lowered, and loss in the curved waveguide area b is great. Thus, the gain is reduced. The passive waveguide 12 is formed under the active layer 14 to increase the coupling efficiency of the light so as to minimize the loss occurring in the curved waveguide area b.

A width of the active layer 14 is within a range of between 1 μm and 1.5 μm, and the width of the tapered optical waveguide 15 tapers from the range of between 1 μm and 1.5 μm, which is the end of curved waveguide area b and is also the end of the active layer 14, down to 0.2 μm. As a result, a mode size can be changed. A width of the end of the tapered optical waveguide 15 is adjusted to about 0.2 μm using undercutting of wet etching to prevent the tapered optical waveguide 15 from being non-uniformly regrown. In the optical waveguide according to the present embodiment, the linear waveguide area a has a length of 400 μm, the curved waveguide area b has a length of 60 μm, the tapered area c has a length of 300 μm, and the area d has a length of 40 μm, wherein the area d is combined with the passive waveguide 12 through which light advances.

Figure 2A:
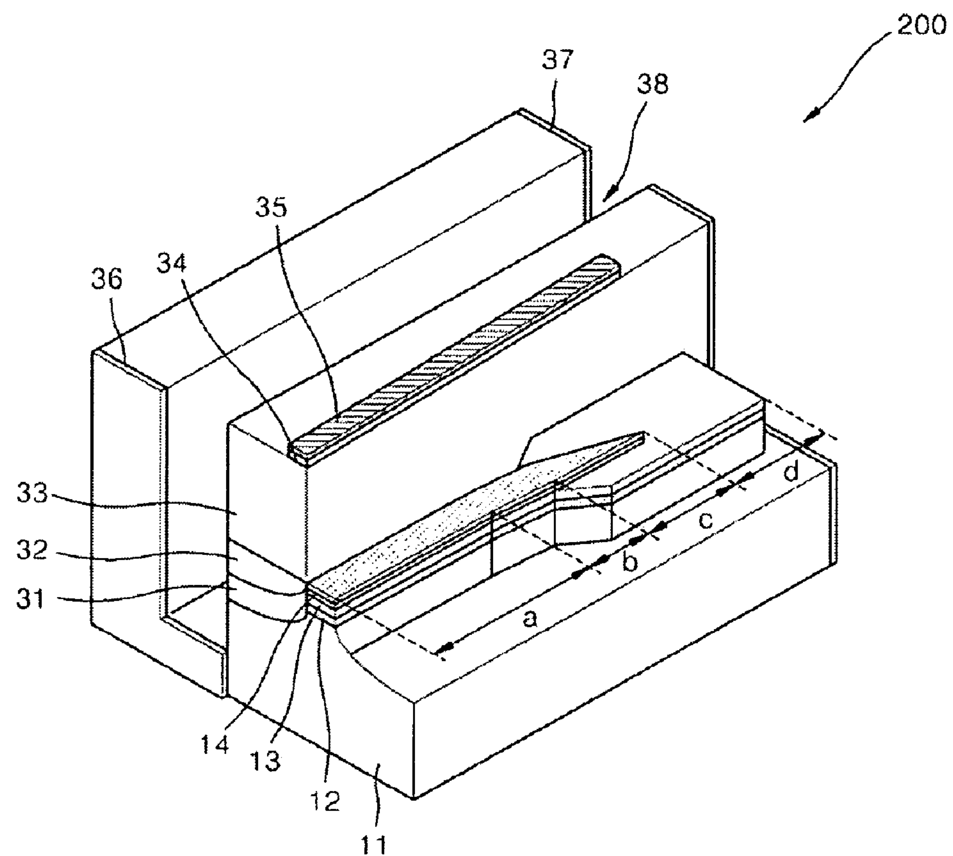
FIG. 2A is a perspective view of an SLD/R-SOA 200 according to another embodiment of the present invention.
Figure 2B:
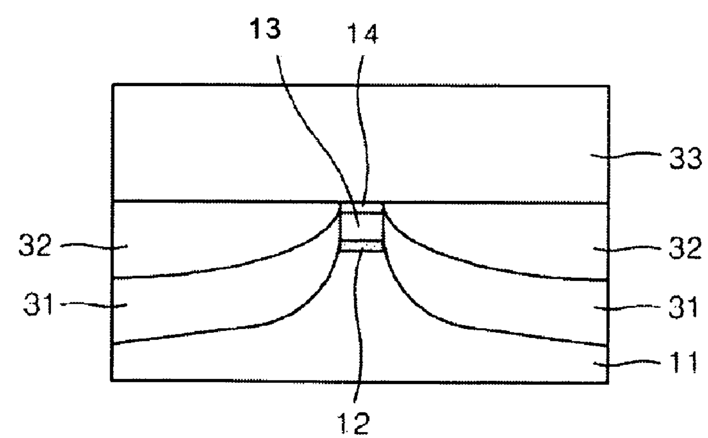
FIG. 2B is a cross-sectional view of an active area a of FIG. 2A.
Figure 2C:
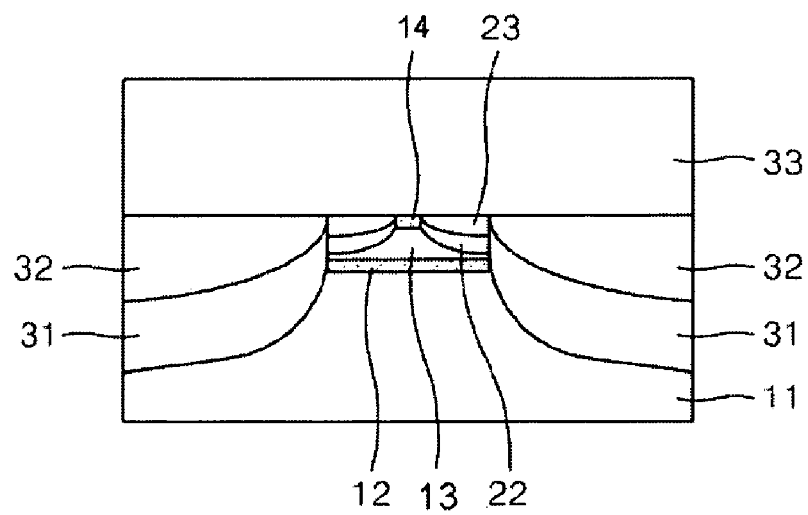
FIG. 2C is a cross-sectional view of a tapered area c of FIG. 2A.
Figure 2D:
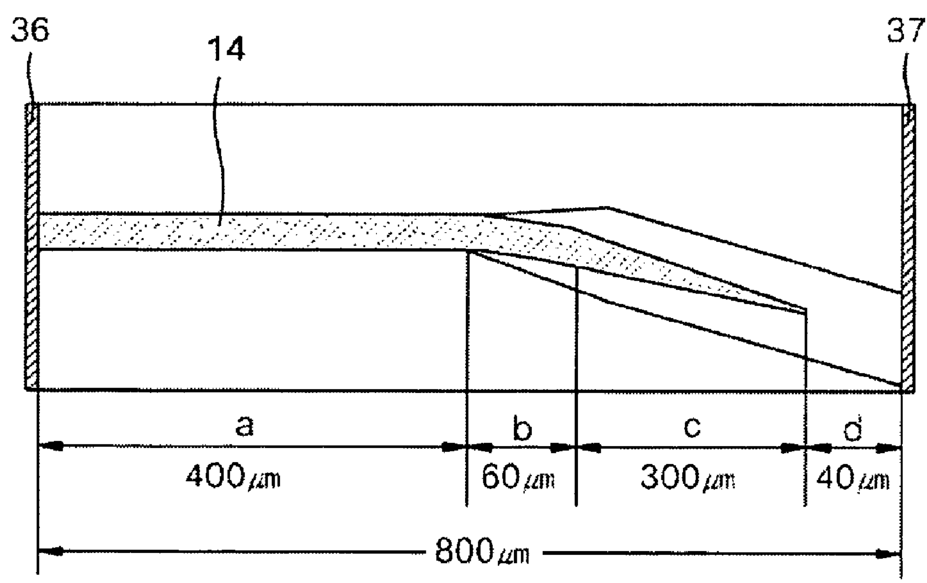
FIG. 2D is a schematic plan view of an optical waveguide of FIG. 2A.

FIG. 2A is a perspective view of an SLD/R-SOA 200 according to another embodiment of the present invention, FIG. 2B is a cross-sectional view of an active area a of FIG. 2A, FIG. 2C is a cross-sectional view of a tapered area c of FIG. 2A, and FIG. 2D is a schematic plan view of an optical waveguide portion of FIG. 2A.

The SLD/R-SOA 200 according to the present embodiment has the same structure as the SLD/R-SOA 100 of FIG. 1A except for the structure of the optical waveguide. In detail, the SLD/R-SOA 100 of FIG. 1A has a structure in which the active layer 14 is butt-coupled to the tapered area c. However, the SLD/R-SOA 200 has a structure in which an active layer 14 is formed to the tapered area c which is formed by same material of areas a, b. Thus, a total length of the active layer 14 is 760 μm.

The SLD/R-SOA 200 is also the same as the SLD/R-SOA 100 except that the active layer 14 is formed to the tapered area c. Thus, as in the SLD/R-SOA 100, the entire area (a, b, and c) of the optical waveguide has a BH structure in the SLD/R-SOA 200. Thus, a light source having low operating and threshold currents can be manufactured. Also, a trench 38 is formed beside the active layer 14 as shown in FIG. 2A to perform superhigh speed operations. Thus, the SLD/R-SOA 200 according to the present embodiment has a good superhigh speed modulation characteristic of 1.25 Gbp/s or more.

As described above, in an R-SOA and an SLD according to the present invention, the entire area of an optical waveguide can be formed to have a BH structure. Thus, a light source having a great gain at a low current and consuming a small amount of power at a low threshold current can be manufactured. Furthermore, the SLD and/or R-SOA can have a superhigh speed modulation characteristic of 1.25 Gbp/s or more.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An SLD (superluminescent diode) comprising:

a substrate;

an optical waveguide comprising a lower clad layer, an active layer dependent on the polarization of light, and an upper clad layer sequentially stacked on the substrate, the optical waveguide comprising linear, curved, and tapered waveguide areas, the tapered waveguide area including the active layer or a tapered waveguide; and first current blocking layers and second current blocking layers formed around the optical waveguide to block a flow of current out of the active layer, wherein the first current blocking layers are positioned at left and right sides of at least one of the tapered waveguide and the active layer of the tapered waveguide area, forming a first BH (buried hetero) structure, and wherein the second current blocking layers are positioned at leftmost and rightmost sides of the first current blocking layers, forming a second BH structure.

2. The SLD of claim 1, wherein a passive waveguide is disposed under the active layer.

3. The SLD of claim 2, wherein the first current blocking layers are disposed on an upper side of the passive waveguide and the second current blocking layers are disposed at left and right sides of the passive waveguide.

4. The SLD of claim 1, wherein the tapered waveguide area includes the tapered waveguide, and the active layer is butt-coupled to the tapered waveguide.

5. The SLD of claim 4, wherein the tapered waveguide is formed of InGaAsP.

6. The SLD of claim 1, wherein the tapered waveguide area includes the tapered waveguide, and the active layer is formed of a same material in the linear, carved, and tapered waveguide areas.

7. The SLD of claim 1, wherein p-InP, n-InP, and p-InP layers are formed around the linear waveguide area as the second current blocking layers.

8. The SLD of claim 1, wherein p-InP and n-InP layers are formed around the tapered waveguide area as the first current blocking layers, and p-InP, n-InP, and p-InP layers are formed around the tapered waveguide area as the second current blocking layers.

9. The SLD of claim 1, further comprising a trench formed by removing portions of the second current blocking layers and the substrate.

10. The SLD of claim 1, wherein the active layer in the linear and curved waveguide areas and the second current blocking layers adjacent to the active layer in the linear and curved waveguide areas collectively form a third BH structure, such that the second current blocking layers are positioned at left and right sides of the active layer.

11. The SLD of claim 1, wherein the active layer has a multi-quantum well (MQW) structure.

* * * * *